(12) United States Patent
Gagas et al.

(10) Patent No.: US 11,876,472 B2
(45) Date of Patent: Jan. 16, 2024

(54) METHOD AND SYSTEM FOR MONITORING A CURRENT SENSOR

(71) Applicant: GM GLOBAL TECHNOLOGY OPERATIONS LLC, Detroit, MI (US)

(72) Inventors: Brent S. Gagas, Pleasant Ridge, MI (US); Brian A. Welchko, Oakland Township, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 68 days.

(21) Appl. No.: 17/700,193

(22) Filed: Mar. 21, 2022

(65) Prior Publication Data

US 2023/0299705 A1  Sep. 21, 2023

(51) Int. Cl.
*H02P 29/024* (2016.01)

(52) U.S. Cl.
CPC .................. *H02P 29/024* (2013.01)

(58) Field of Classification Search
CPC .. G01S 7/40; G01D 1/00; G01D 15/14; H02P 29/024

See application file for complete search history.

(56) References Cited

U.S. PATENT DOCUMENTS

2015/0123578 A1* 5/2015 Schulz .................... H02P 23/14
318/400.04

\* cited by examiner

*Primary Examiner* — Said Bouziane
(74) *Attorney, Agent, or Firm* — Quinn IP Law

(57) ABSTRACT

The disclosure includes a control system for a multi-phase electric machine that includes an inverter configured to transfer electric energy from a rechargeable energy storage device (RESS), and phase current sensors. A controller includes an executable instruction set to monitor, via the phase current sensors, the phase currents, and detect that one of the phase currents is outside a linear measurement range of a respective one of the phase current sensors. An extrapolated current for the respective one of the phase current sensors is determined based upon the phase currents from others of the phase current sensors. A current extrapolation routine evaluates the respective one of the phase current sensors. A fault is detected in the respective one of the phase current sensors based upon the current extrapolation routine and the extrapolated current.

17 Claims, 2 Drawing Sheets

METHOD AND SYSTEM FOR MONITORING A CURRENT SENSOR

INTRODUCTION

In a multi-phase electric machine, traction torque or reactive torque may be generated by multiple alternating current (AC) waveforms that pass through three or more phase leads. The multiple AC waveforms operate at the same frequency and amplitude, but with a time offset or phase shift between the different phases. In a vehicle or other system using an electric machine, an application of phased AC waveforms to individual stator windings induces a changing magnetic field. This magnetic field causes the rotation of a rotor to occur, which in turn provides motor output torque or regenerative torque. The motor output torque may be harnessed and directed as needed to perform useful work, e.g., propelling the vehicle.

Current sensors may be employed to dynamically monitor magnitudes of the electric currents passing through the multiple phase leads, with operation and control of an electric machine being based upon feedback from the current sensors. A current sensor may include a sensing element and an electronic circuit. The sensing element generates a signal output that is linear over a calibrated current range, meaning that the voltage signal output from the current sensor has a linear relationship that correlates to measured current. When monitored current is greater than a linear current range of the sensor, the signal output from the sensor may be non-linear and eventually saturated. There may be benefits to operating an electric machine at current levels that are greater than the linear range of the current sensors.

Vehicles and other devices that employ electric machines and associated current sensors monitor and evaluate signal outputs from the current sensors to detect occurrence of sensor-related faults.

SUMMARY

There is a need for an electric machine and associated control system that is capable of monitoring current sensors to detect occurrence of sensor-related faults under various all operating conditions, including operating conditions in which the current sensors are measuring currents outside their linear ranges.

The concepts described herein provide for a method, apparatus, and control system for a multi-phase electric machine that is capable of monitoring current sensors to detect occurrence of sensor-related faults under various operating conditions, including operating conditions in which the current sensors are measuring currents outside their linear ranges.

An aspect of the disclosure includes a control system for a multi-phase electric machine that includes an inverter configured to transfer electric energy from a rechargeable energy storage device (RESS) to the multi-phase electric machine, a plurality of phase current sensors, wherein the plurality of phase current sensors are arranged to monitor a plurality of phase currents being transferred to the multi-phase electric machine; and a controller. The controller is operatively connected to the inverter and in communication with the plurality of phase current sensors, and includes an executable instruction set to monitor, via the plurality of phase current sensors, the plurality of phase currents, and detect that one of the plurality of phase currents is outside a linear measurement range of a respective one of the plurality of phase current sensors. An extrapolated current for the respective one of the plurality of phase current sensors is determined based upon the phase currents from others of the plurality of phase current sensors. A current extrapolation routine is employed evaluate the respective one of the plurality of phase current sensors. A fault is detected in the respective one of the plurality of phase current sensors based upon the current extrapolation routine and the extrapolated current.

Another aspect of the disclosure includes the instruction set being executable to evaluate, via the current extrapolation routine, the respective one of the plurality of phase current sensors by determining a zero-sum-shift parameter based upon the extrapolated current for the respective one of the plurality of phase current sensors; and evaluating the respective one of the plurality of phase current sensors based upon the zero-sum-shift parameter and a respective one of the monitored phase currents.

Another aspect of the disclosure includes the instruction set being executable to determine the zero-sum-shift parameter based upon the extrapolated current for the respective one of the plurality of phase current sensors by determining a linear approximation of the signal output of the respective one of the plurality of phase current sensors in relation to the extrapolated current.

Another aspect of the disclosure includes the instruction set being executable to detect the fault in the respective one of the plurality of phase current sensors when the respective one of the monitored phase currents differs from a combination of the zero-sum-shift parameter and the respective one of the monitored phase currents by an amount that is greater than a first threshold.

Another aspect of the disclosure includes the instruction set being executable to control operation of the electric machine in response to the fault in the respective one of the plurality of phase current sensors.

Another aspect of the disclosure includes the instruction set being executable to detect the fault in the respective one of the plurality of phase current sensors when the extrapolated current for the respective one of the plurality of phase current sensors differs from the maximum value for the measured current for the respective one of the plurality of phase current sensors in combination with the learned offset by an amount that is greater than a second threshold.

Another aspect of the disclosure includes periodically disabling execution of the instruction set.

Another aspect of the disclosure includes the plurality of phase current sensors being Hall effect sensors.

Another aspect of the disclosure includes a control system for a multi-phase electric machine that includes an inverter configured to transfer electric energy from a rechargeable energy storage device (RESS) to the multi-phase electric machine; a plurality of phase current sensors, wherein the plurality of phase current sensors are arranged to monitor a plurality of phase currents being transferred to the multi-phase electric machine; and a controller that is operatively connected to the inverter and in communication with the plurality of phase current sensors. The controller includes an instruction set that is executable to monitor, via the plurality of phase current sensors, the plurality of phase currents, detect that one of the plurality of phase currents is outside a linear measurement range of a respective one of the plurality of phase current sensors, determine an extrapolated current for the respective one of the plurality of phase current sensors based upon the phase currents from others of the plurality of phase current sensors, evaluate, via a current extrapolation routine, the respective one of the plurality of phase current sensors, and detect a fault in the respective one of the plurality of phase current sensors based upon the current extrapolation routine.

Another aspect of the disclosure includes a method for monitoring a control system for a multi-phase electric machine that includes monitoring, via a plurality of phase current sensors, the plurality of phase currents transferred from an inverter to the multi-phase electric machine, detecting that one of the plurality of phase currents is outside a linear measurement range of a respective one of the plurality of phase current sensors based upon the phase currents from others of the plurality of phase current sensors, determining an extrapolated current for the respective one of the plurality of phase current sensors, evaluating the respective one of the plurality of phase current sensors and detecting a fault in the respective one of the plurality of phase current sensors based upon the current extrapolation routine.

The above summary is not intended to represent every possible embodiment or every aspect of the present disclosure. Rather, the foregoing summary is intended to exemplify some of the novel aspects and features disclosed herein. The above features and advantages, and other features and advantages of the present disclosure, will be readily apparent from the following detailed description of representative embodiments and modes for carrying out the present disclosure when taken in connection with the accompanying drawings and the claims.

BRIEF DESCRIPTION OF THE DRAWINGS

One or more embodiments will now be described, by way of example, with reference to the accompanying drawings, in which.

Figure 1:
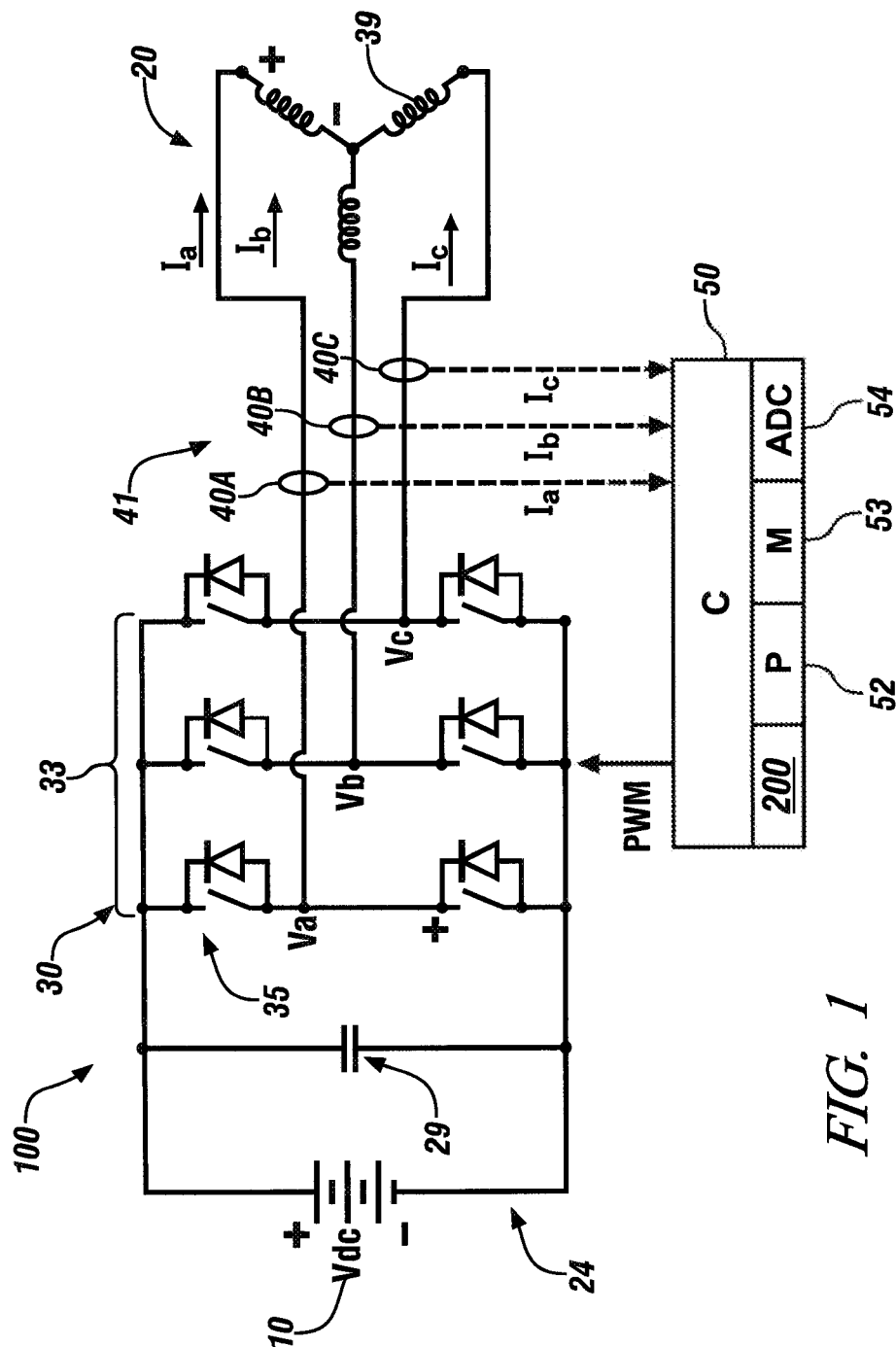
FIG. 1 schematically illustrates a multi-phase electric machine and control system, in accordance with the disclosure.

The appended drawings are not necessarily to scale, and may present a somewhat simplified representation of various preferred features of the present disclosure as disclosed herein, including, for example, specific dimensions, orientations, locations, and shapes. Details associated with such features will be determined in part by the particular intended application and use environment.

DETAILED DESCRIPTION

The components of the disclosed embodiments, as described and illustrated herein, may be arranged and designed in a variety of different configurations. Thus, the following detailed description is not intended to limit the scope of the disclosure, as claimed, but is merely representative of possible embodiments thereof. In addition, while numerous specific details are set forth in the following description in order to provide a thorough understanding of the embodiments disclosed herein, some embodiments can be practiced without some of these details. Moreover, for the purpose of clarity, certain technical material that is understood in the related art has not been described in detail in order to avoid unnecessarily obscuring the disclosure.

Furthermore, the drawings are in simplified form and are not to precise scale. For purposes of convenience and clarity only, directional terms such as top, bottom, left, right, up, over, above, below, beneath, rear, and front, may be used with respect to the drawings. These and similar directional terms are not to be construed to limit the scope of the disclosure. Furthermore, the disclosure, as illustrated and described herein, may be practiced in the absence of an element that is not specifically disclosed herein. Throughout the drawings, corresponding reference numerals indicate like or corresponding parts and features.

As used herein, the term "system" may refer to one of or a combination of mechanical and electrical actuators, sensors, controllers, application-specific integrated circuits (ASIC), combinatorial logic circuits, software, firmware, and/or other components that are arranged to provide the described functionality.

Exemplary embodiments may be described herein in terms of functional and/or logical block components and various processing steps. It should be appreciated that such block components may be realized by a combination or collection of mechanical and electrical hardware, software, and/or firmware components configured to perform the specified functions. For example, an embodiment of the invention may employ various combinations of mechanical components and electrical components, integrated circuit components, memory elements, digital signal processing elements, logic elements, look-up tables, or the like, which may carry out a variety of functions under the control of one or more microprocessors or other control devices. In addition, those skilled in the art will appreciate that the exemplary embodiments may be practiced in conjunction with other mechanical and/or electronic systems, and that the vehicle systems described herein are merely exemplary embodiment of possible implementations.

The use of ordinals such as first, second and third does not necessarily imply a ranked sense of order, but rather may only distinguish between multiple instances of an act or structure.

Referring to the drawings, wherein like reference numerals correspond to like or similar components throughout the several Figures, FIG. 1, consistent with embodiments disclosed herein, illustrates a non-limiting example of a multi-phase motor drive system 100. In one embodiment, the multi-phase motor drive system 100 may be disposed to provide propulsion torque in a vehicle. The vehicle may include, but not be limited to a mobile platform in the form of a commercial vehicle, industrial vehicle, agricultural vehicle, passenger vehicle, aircraft, watercraft, train, all-terrain vehicle, personal movement apparatus, robot and the like to accomplish the purposes of this disclosure.

The multi-phase motor drive system 100 includes a rechargeable energy storage device (RESS) 10, a multi-phase rotary electric machine 20, an inverter 30, and a controller (C) 50. The inverter 30 transforms DC electric energy from the RESS 10 to AC electric energy that is supplied to phases of the multi-phase rotary electric machine 20 to generate torque in response to control commands from the controller 50. The controller 50 is programmed in software and equipped in hardware to execute recorded instructions embodying the current sensor monitoring scheme 200 for increasing an electrical current sensing range of a plurality of phase current sensors employed within the motor drive system 100, e.g., phase current sensors 40A, 40B, 40C that are employed when the multi-phase rotary electric machine 20 is a three-phase machine. While it is may be practical to implement the following approach digitally in a microcontroller, it may instead be implemented employing discrete components in one embodiment. For consistency, the controller 50 will be described hereinafter.

In one embodiment, the multi-phase motor drive system 100 may be employed in a vehicle, with the multi-phase electric machine 20 being a traction motor that provides propulsion torque.

The power inverter 24 is configured with control circuits including power transistors, e.g., IGBTs for transforming high-voltage DC electric power to high-voltage AC electric power and transforming high-voltage AC electric power to high-voltage DC electric power. The power inverter 24 may employ pulsewidth-modulating (PWM) control of the IGBTs to convert stored DC electric power originating in the RESS 10 to AC electric power to drive the rotary electric machine 20 to generate torque. Similarly, the power inverter 24 converts mechanical power transferred to the rotary electric machine 20 to DC electric power to generate electric energy that is storable in the RESS 10, including as part of a regenerative braking control strategy when employed on-vehicle. The power inverter 24 receives motor control commands from the controller 50 and controls inverter states to provide the motor drive and regenerative braking functionality.

The RESS 10 is a rechargeable device, e.g., a multi-cell lithium ion or nickel metal hydride battery.

The phase currents delivered to the electric machine 20 are individually and separately measured via phase current sensors 40A, 40B, 40C using a measurement process.

The controller 50 includes a processor (P) 52 and tangible, non-transitory memory (M) 53 on which is recorded instructions embodying the current sensor monitoring scheme 200. The controller 50 may also include an analog-to-digital converter (ADC) 54. The ADC 54 may be embodied as an electrical circuit providing a specific sampling rate which provides quantization of the continuous/analog voltage input and outputs a representative digital signal. The memory 53 may include read-only memory (ROM), flash memory, optical memory, additional magnetic memory, etc., as well as random access memory (RAM), electrically-programmable read only memory (EPROM), a high-speed clock, analog-to-digital (A/D) and/or digital-to-analog (D/A) circuitry, input/output circuitry or devices, and signal conditioning and buffer circuitry.

The controller 50 commands, or causes the inverter 30 to generate a set of pulsewidth modulation signals (arrow PWM). These PWM signals provide switching control of the input voltage used to power the multi-phase electric machine 20. The controller 50 receives the three measured phase current signals from the phase current sensors 40A, 40B, 40C.

The phase current sensors 40A, 40B, 40C may be Hall effect sensors in one embodiment. A Hall effect sensor includes a magnetic core that functions as a flux concentrator and an integrated circuit. The magnetic core has a toroidal shape or a rectangular shape with a hole in the center through which an electrical current-carrying conductor, e.g., a phase lead 41, is passed. The magnetic core may have a complete toroidal shape, a partial toroidal shape, a U-shape, or another shape that is able to provide the flux concentrator function. The Hall effect circuit outputs a voltage proportional to the current flowing through the center of the magnetic core. The magnetic core serves to concentrate the flux surrounding the current carrying wire, and shields against unwanted stray electrical or magnetic fields.

Hall effect current sensors have a finite operating range above which the sensor output is saturated. The operating range, i.e., a maximum amplitude of electrical current which can be reliably and accurately measured, can be limited by several factors. The sensor output cannot exceed its supply voltage range. Hence, at large electrical current values, the sensor output will be limited by the supply voltage, above which the measured current signal is saturated. Furthermore, the magnetic core may be composed of ferrite or silicon steel. These materials have a limited magnetization range above which the core saturates. The sensor gain, typically specified in volts per amp of output signal, is dramatically reduced when the core saturates. Hence, the accuracy of the phase current sensor may degrade, and the measured current may be effectively clipped.

Multi-phase motor systems may require accurate sensing of each of the applied phase currents, e.g., currents $I_a$, $I_b$, and $I_c$. Measured phase currents can be used for various motor control, feedback, diagnostic, and monitoring purposes. In the example system of FIG. 1, the phase current sensors 40A, 40B, 40C are used to individually measure the phase currents flowing from the inverter 30 to the multi-phase electric machine 20. In one embodiment, the phase current sensors 40A, 40B, 40C are positioned in the inverter 30 as shown, although the phase current sensors 40A, 40B, 40C may be positioned between the inverter 30 and the electric machine 20 whose phase currents are being measured. Representation of the electric traction motor 22 is omitted for illustrative simplicity.

Additionally, the measured phase currents ($I_a$, $I_b$, and $I_c$) can be used for motor control and diagnostic fault protection such as overcurrent or detection of open circuit on one or more of the phases. The measured phase current information may also be used to track thermal and other stresses applied to predict potential degradation to system components. One example is the monitoring for potential demagnetization of a permanent magnet (PM) motor due to excessive applied stator currents, with the accurate current information being vital to proper control, protection, and prediction of a system state of health, e.g., of a rotor of the electric machine 20.

Figure 3:
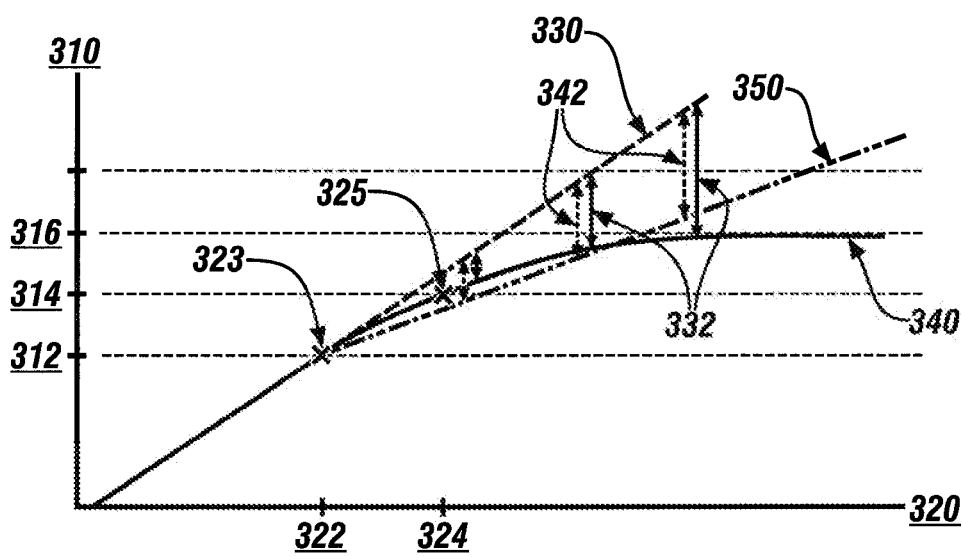
FIG. 3 graphically illustrates parameters related to operation of an embodiment of the current sensor that is described with reference to FIG. 1, in accordance with the disclosure.

Sensors used in multiphase motor drive systems have a finite electrical current measurement range. When the physical phase current exceeds the measurement range capability of a given sensor, such as the example phase current sensors 40A, 40B, 40C, the phase current may be inaccurately measured, with the level of inaccuracy depending on the degree of saturation. The measured phase currents may be distorted or clipped as shown in FIG. 3, thus resulting in measured current values that are lower than actual current values. This condition may result in degradation of control and/or diagnostic algorithms that rely on accurate phase current measurement.

The term "controller" and related terms such as microcontroller, control, control unit, processor, etc. refer to one or various combinations of Application Specific Integrated Circuit(s) (ASIC), Field-Programmable Gate Array(s) (FPGA), electronic circuit(s), central processing unit(s), e.g., microprocessor(s) and associated non-transitory memory component(s) in the form of memory and storage devices (read only, programmable read only, random access, hard drive, etc.). The non-transitory memory component is capable of storing machine readable instructions in the form of one or more software or firmware programs or routines, combinational logic circuit(s), input/output circuit(s) and devices, signal conditioning, buffer circuitry and other components, which can be accessed by and executed by one or more processors to provide a described functionality. Input/ output circuit(s) and devices include analog/digital converters and related devices that monitor inputs from sensors, with such inputs monitored at a preset sampling frequency or in response to a triggering event. Software, firmware, programs, instructions, control routines, code, algorithms, and similar terms mean controller-executable instruction sets including calibrations and look-up tables. Each controller executes control routine(s) to provide desired functions. Routines may be executed at regular intervals, for example every 100 microseconds during ongoing operation. Alternatively, routines may be executed in response to occurrence of a triggering event. Communication between controllers, actuators and/or sensors may be accomplished using a direct wired point-to-point link, a networked communication bus link, a wireless link, or another communication link. Communication includes exchanging data signals, including, for example, electrical signals via a conductive medium; electromagnetic signals via air; optical signals via optical waveguides; etc. The data signals may include discrete, analog and/or digitized analog signals representing inputs from sensors, actuator commands, and communication between controllers.

The term "signal" refers to a physically discernible indicator that conveys information, and may be a suitable waveform (e.g., electrical, optical, magnetic, mechanical or electromagnetic), such as DC, AC, sinusoidal-wave, triangular-wave, square-wave, vibration, and similar signals that are capable of traveling through a medium.

The terms "calibration", "calibrated", and related terms refer to a result or a process that correlates a desired parameter and one or multiple perceived or observed parameters for a device or a system. A calibration as described herein may be reduced to a storable parametric table, a plurality of executable equations or another suitable form that may be employed as part of a measurement or control routine.

A parameter is defined as a measurable quantity that represents a physical property of a device or other element that is discernible using one or more sensors and/or a physical model. A parameter can have a discrete value, e.g., either "1" or "0", or can be infinitely variable in value.

Figure 2:
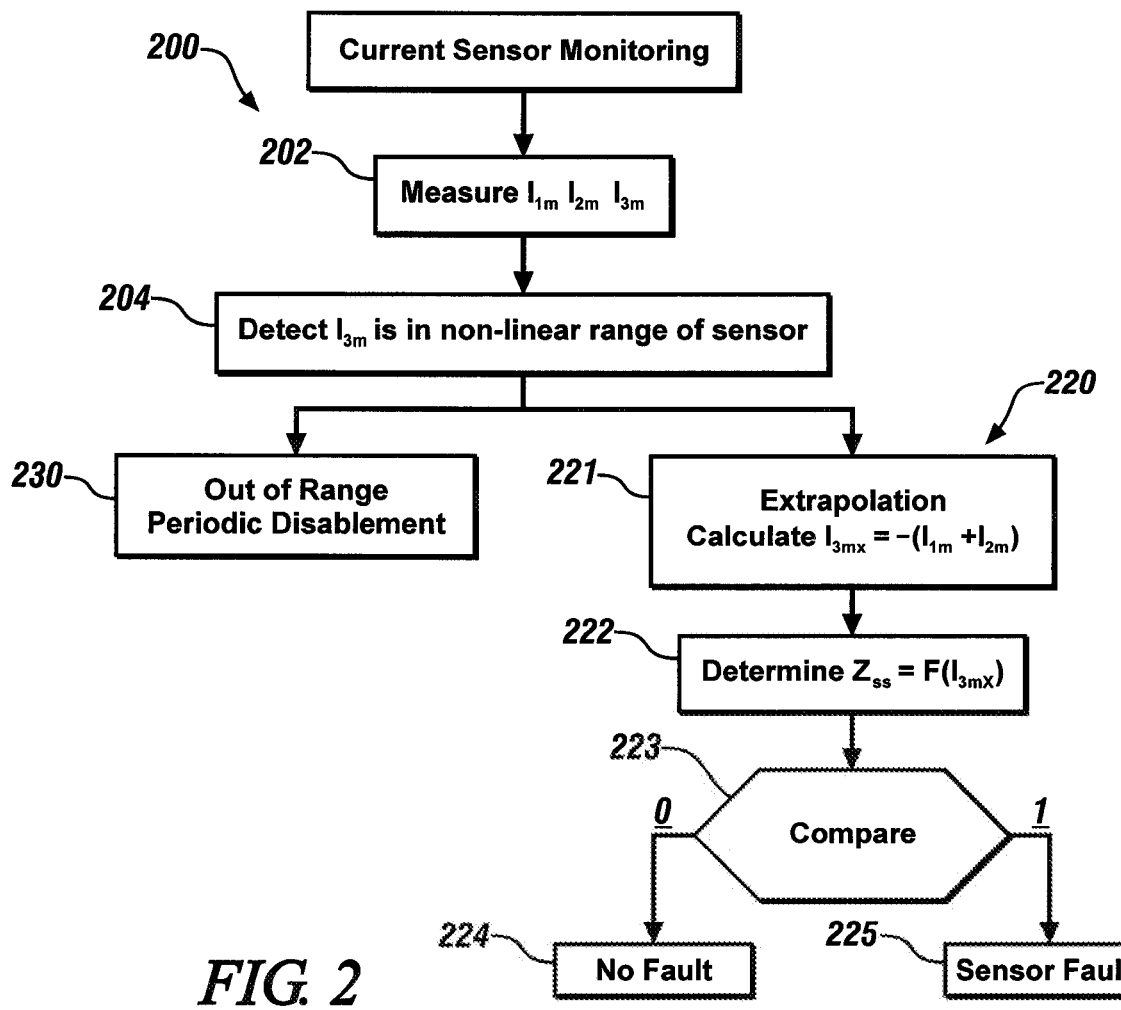
FIG. 2 schematically illustrates a current sensor monitoring scheme that may be executed by the system described with reference to FIG. 1 to dynamically monitor signal outputs of the current sensors, in accordance with the disclosure.

FIG. 2 schematically illustrates a current sensor monitoring scheme 200 that may be executed by the system 100 described with reference to FIG. 1 to dynamically monitor signal outputs of the current sensors 40A, 40B, 40C and detect issues related to measurement performance, including sensor correlation. This includes current sensor extrapolation when one of the current sensors is outside of its linear range. This allows for the use of an extrapolated current for motor controls and real-time diagnostics. As employed herein, the term "1" indicates an answer in the affirmative, or "YES", and the term "0" indicates an answer in the negative, or "NO".

The current sensor monitoring scheme 200 includes a current extrapolation routine 220 and an out-of-range periodic disablement routine 230.

The current sensor monitoring scheme 200 includes periodically measuring, via the current sensors 40A, 40B, 40C, the phase currents ($I_{1m}$ $I_{2m}$ $I_{3m}$) (Step 202), wherein the phase currents ($I_{1m}$ $I_{2m}$ $I_{3m}$) represent raw signal outputs from the current sensors 40A, 40B, 40C that are adjusted by a learned offset. The learned offset is determined by reading a raw signal outputs from the current sensors 40A, 40B, 40C for a defined time period while inverter switching is disabled. Since switching is disabled, no current flows in the electric machine, and an average value from the raw sensor reading during this condition is known to represent zero physical motor current. The averaged value of the raw sensor reading is then stored as the learned offset and can be subtracted from the sensor during various operating conditions to remove the effect of a nonzero offset the sensor has on the control system operation.

As described hereinafter, phase current $I_{3m}$ represents the current reading having the greatest absolute magnitude (either positive or negative). This measurement may occur every 100 microseconds, or another measurement period. When one of the measured phase currents, e.g., $I_{3m}$, is indicated to be outside the linear range of the respective current sensor (i.e., one of current sensors 40A, 40B, 40C), i.e., when the absolute value of the measured current $I_{3m}$ is greater than the extrapolation threshold current, the current extrapolation routine 220 and the out-of-range periodic disablement routine 230 are executed.

The current extrapolation routine 220 employs Kirchhoff's law to calculate an extrapolated current ($I_{3mx}$) based upon the phase current readings from the in-range sensors, i.e., $I_{1m}$ and $I_{2m}$ (Step 221). This calculation is expressed as follows:

$$I_{3mx} = (I_{1m} + I_{2m}) \quad [1]$$

Note that by Kirchhoff's law, having two ideal in-range readings allows for identically knowing the three phase current readings. This recalculating of an out-of-range phase current from the phase currents measured by the remaining in-range phase sensors increases the measurable AC motor current by 15.5% with no hardware changes. This additional range can be used to increase maximum torque, thus increasing performance, or maintaining performance using a current sensor with a smaller range. The maximum current sensor range bounds the upper limit available motor torque.

The current extrapolation routine 220 employs Kirchhoff's law to calculate the extrapolated current ($I_{3mx}$) based upon the phase current readings from the in-range sensors, i.e., $I_{1m}$ and $I_{2m}$, as described with reference to EQ. 1. (Step 221).

The extrapolated current ($I_{3mx}$) is employed to determine a zero-sum-shift value $Z_{ss}$, which is described with reference to EQ. 2 and FIG. 3. (Step 222).

The current extrapolation routine 220 combines the measured current sum and the zero sum shift ($I_{1m}+I_{2m}+I_{3m}+Z_{SS}$), and compares the result with a threshold (Step 223).

When the measured current sum and zero sum shift ($I_{1m}+I_{2m}+I_{3m}+Z_{SS}$), is within an allowable range of an +/− fault threshold, no fault is indicated (Step 224).

When the measured current sum combined with the zero sum shift, i.e., ($I_{1m}+I_{2m}+I_{3m}+Z_{SS}$) is outside of an allowable range of a +/− fault threshold i.e., is greater than or less than the difference (Step 223)(1), a sensor fault is indicated (Step 225). Stated another way, when an absolute value of the measured current sum and the zero sum shift, i.e., (abs[$I_{1m}+I_{2m}+I_{3m}+Z_{SS}$]) is less than a threshold, a sensor fault is indicated.

Saturation and clipping of the current sensors 40A, 40B, 40C, which occurs beyond the linear range of the respective sensor, produces predictable 3rd harmonics on the zero-sequence current (I0=Ia+Ib+Ic) for an isolated machine, which are deterministic and used to correlate and diagnose the phase current sensors via a continuously executing correlation diagnostic.

As described herein, the control system includes an executable instruction set to monitor, via the plurality of phase current sensors, the plurality of phase currents, and detect that one of the plurality of phase currents is outside a linear measurement range of a respective one of the plurality of phase current sensors. An extrapolated current for the respective one of the plurality of phase current sensors is determined based upon the phase currents from others of the plurality of phase current sensors. A current extrapolation routine evaluates the respective one of the plurality of phase current sensors. A fault is detected in the respective one of the plurality of phase current sensors based upon the current extrapolation routine and the extrapolated current.

The controller includes an instruction set that is executable to monitor, via the plurality of phase current sensors, the plurality of phase currents, detect that one of the plurality of phase currents is outside a linear measurement range of a respective one of the plurality of phase current sensors, determine a zero-sum-shift parameter for the respective one of the plurality of phase current sensors, and detect a fault in the respective one of the plurality of phase current sensors based upon the zero-sum-shift parameter.

The out-of-range periodic disablement routine 230 includes periodically disabling the monitoring the plurality of phase currents upon detecting that one of the plurality of phase currents is outside a linear measurement range of the respective one of the plurality of phase current sensors. This includes periodically implementing a disablement condition for the current sensor Out-Of-Range (OOR) diagnostic for 1 of the 6 out-of-range (OOR) checks, i.e., A hi, A lo, B hi, B lo, C hi, C lo, when the current command is very high, such that extrapolation is required, and the raw current is expected to be saturated in that 60 degree sector. The current command threshold for disabling the OOR diagnostic can be calibrated out as it is not required for every current sensor. A selective disabling condition is added to the Out-of-Range (OOR) diagnostic when the control system commands current to be out of range of the current sensor to prevent false fail counts during 2 sensor extrapolation operation while maintaining OOR diagnostic coverage.

FIG. 3 graphically illustrates parameters related to operation of an embodiment of one of the current sensors 40 described with reference to FIG. 1. Plotted parameters include extrapolated current 330 and measured current 340, which are plotted in context of sensor output 310 (on the vertical axis) in relation to current level 320 (on the horizontal axis).

The measured current 340 includes a linear region prior to a first current threshold at the extrapolation threshold current 322, with a corresponding first sensor voltage 312 that defines a maximum linear limit of the respective phase current sensor. A reduced linearity region is defined between the extrapolation threshold current 322 and the second current threshold 324, which corresponds to a second sensor voltage 314 associated with a reduced linearity limit that is indicated by extrapolation point 325. An out-of-range region is defined after the second current threshold 324. Sensor saturation occurs at third sensor voltage 316. By way of a non-limiting example, when nominal power to the current sensor is 5V, the first sensor voltage 312 defining the maximum linear limit may be at or about 4.5V, the second sensor voltage 314 defining the out-of-range region may be at or about 4.75V, and the third sensor voltage 316 defining saturation may be at or about 4.95V.

The extrapolated current line 330 represents actual current being transferred to the electric machine, and may be determined by Kirchhoff's law, which says that, in a three-phase system, the sum of the three phase currents ($I_a$, $I_b$, and $I_c$) is equal to zero. Thus, when the current sensor measuring one of the phase currents, e.g., $I_a$, is out-of-range, the current sensor readings for the other two of the phase currents, e.g., $I_b$ and $I_c$, can be employed to calculate the magnitude of the out-of-range phase current, e.g., $I_a$.

An extrapolated sum shift line 350 originates at extrapolation origin point 323 with corresponding first sensor voltage 312 defining the maximum linear limit for the respective phase current sensor. The extrapolated sum shift line 350 can be determined as follows:

$$Z_{SS} = \text{Gain} * \text{sign}(I_{3mx}) * [\text{abs}(I_{3mx}) - \text{extrapolation threshold current}] \quad [2]$$

wherein:
$Z_{SS}$ represents the zero-sum-shift;
Gain represents a normalized factor that represents how sharply the current sensor saturates. A gain of 0 indicates no saturation, and a gain of 1 indicates the sensor clips completely and continues to read the extrapolation threshold even if the actual current continues to increase. A gain in the range of 0.2 to 0.5 is typical for current sensors used in motor drive applications;
$I_{3mx}$ represents the extrapolated current value of the out-of-range current sensor; and
extrapolation threshold current represents the extrapolation origin point 323.

The extrapolated sum shift line 350 provides a linear approximation of the signal output of the presently out-of-range current sensor in relation to the extrapolated current 330.

Lines 342 each represent a difference between the extrapolated current (from line 330) and the measured current (from line 340), which varies with the extrapolated current.

Lines 332 each represent a difference between the extrapolated current (from line 330) and the extrapolated current (from line 350).

When the current is greater than the sensor saturation limit indicated by the third sensor voltage 316, the signal output from the current sensor is unchanged, regardless of the magnitude of the current.

When the sensor current is greater than the extrapolation threshold current, the highest phase current is extrapolated so that the raw saturated measurement is not used for feedback to the closed loop control system. A blending region is used to smooth the transition between 3 sensor and 2 sensor current extrapolation for feedback current.

The raw current sensor measurements are continuously used for diagnostic inputs regardless of current level, and the diagnostics are modified to provide full diagnostic coverage without false fail counts. A selective disabling condition is added to the Out-of-Range (OOR) diagnostic when the control system commands current to be out of range of the current sensor to prevent false fail counts during 2 sensor extrapolation operation while maintaining OOR diagnostic coverage.

The flowchart and block diagrams in the flow diagrams illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by dedicated-function hardware-based systems that perform the specified functions or acts, or combinations of dedicated-function hardware and computer instructions. These computer program instructions may also be stored in a computer-readable medium that can direct a computer or other programmable data processing apparatus to function in a particular manner, such that the instructions stored in the computer-readable medium produce an article of manufacture including instruction set that implements the function/act specified in the flowchart and/or block diagram block or blocks.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the claims.

What is claimed is:

1. A control system for a multi-phase electric machine, comprising:
    an inverter configured to transfer electric energy from a rechargeable energy storage device (RESS) to the multi-phase electric machine;
    a plurality of phase current sensors, wherein the plurality of phase current sensors are arranged to monitor a plurality of phase currents being transferred to the multi-phase electric machine; and
    a controller;
    the controller being operatively connected to the inverter and in communication with the plurality of phase current sensors;
    the controller including an instruction set, the instruction set being executable to:
        monitor, via the plurality of phase current sensors, the plurality of phase currents,
        detect that one of the plurality of phase currents is outside a linear measurement range of a respective one of the plurality of phase current sensors,
        determine an extrapolated current for the respective one of the plurality of phase current sensors based upon the phase currents from others of the plurality of phase current sensors;
        evaluate, via a current extrapolation routine, the respective one of the plurality of phase current sensors, including determining a zero-sum-shift parameter based upon the extrapolated current for the respective one of the plurality of phase current sensors, and evaluating the respective one of the plurality of phase current sensors based upon the zero-sum-shift parameter and a respective one of the monitored phase currents; and
        detect a fault in the respective one of the plurality of phase current sensors based upon the current extrapolation routine and the extrapolated current.

2. The control system of claim 1, wherein the instruction set being executable to determine the zero-sum-shift parameter based upon the extrapolated current for the respective one of the plurality of phase current sensors comprises the instruction set being executable to determine a linear approximation of a signal output of the respective one of the plurality of phase current sensors in relation to the extrapolated current.

3. The control system of claim 1, wherein the instruction set is executable to detect the fault in the respective one of the plurality of phase current sensors when the respective one of the monitored phase currents differs from a combination of the zero-sum-shift parameter and the respective one of the monitored phase currents by an amount that is greater than a first threshold.

4. The control system of claim 3, further comprising the instruction set being executable to control operation of the electric machine in response to the fault in the respective one of the plurality of phase current sensors.

5. The control system of claim 1, wherein the instruction set being executable to evaluate, via the current extrapolation routine, the respective one of the plurality of phase current sensors comprises the instruction set being executable to compare the extrapolated current for the respective one of the plurality of phase current sensors and a maximum value for the measured current for the respective one of the plurality of phase current sensors in combination with a learned offset.

6. The control system of claim 5, wherein the instruction set is executable to detect the fault in the respective one of the plurality of phase current sensors when the extrapolated current for the respective one of the plurality of phase current sensors differs from the maximum value for the measured current for the respective one of the plurality of phase current sensors in combination with the learned offset by an amount that is greater than a second threshold.

7. The control system of claim 1, further comprising periodically disabling monitoring the plurality of phase currents upon detecting that one of the plurality of phase currents is outside a linear measurement range of the respective one of the plurality of phase current sensors.

8. The control system of claim 1, wherein the plurality of phase current sensors comprise Hall effect sensors.

9. A control system for a multi-phase electric machine, comprising:
    an inverter configured to transfer electric energy from a rechargeable energy storage device (RESS) to the multi-phase electric machine;
    a plurality of phase current sensors, wherein the plurality of phase current sensors are arranged to monitor a plurality of phase currents being transferred to the multi-phase electric machine; and
    a controller that is operatively connected to the inverter and in communication with the plurality of phase current sensors;
    the controller including an instruction set, the instruction set being executable to:
        monitor, via the plurality of phase current sensors, the plurality of phase currents,
        detect that one of the plurality of phase currents is outside a linear measurement range of a respective one of the plurality of phase current sensors,
        determine an extrapolated current for the respective one of the plurality of phase current sensors based upon the phase currents from others of the plurality of phase current sensors;
        evaluate, via a current extrapolation routine, the respective one of the plurality of phase current sensors, including determining a zero-sum-shift parameter based upon the extrapolated current for the respective one of the plurality of phase current sensors, and evaluating the respective one of the plurality of phase current sensors based upon the zero-sum-shift parameter and a respective one of the monitored phase currents; and
        detect a fault in the respective one of the plurality of phase current sensors based upon the current extrapolation routine.

10. The control system of claim 9 wherein the instruction set being executable to determine the zero-sum-shift parameter based upon the extrapolated current for the respective one of the plurality of phase current sensors comprises the instruction set being executable to determine a linear approximation of a signal output of the respective one of the plurality of phase current sensors in relation to the extrapolated current.

11. The control system of claim 9, wherein the instruction set is executable to detect the fault in the respective one of the plurality of phase current sensors when the respective one of the monitored phase currents differs from a combination of the zero-sum-shift parameter and the respective one of the monitored phase currents by an amount that is greater than a first threshold.

12. The control system of claim 11, further comprising the instruction set being executable to control operation of the electric machine in response to the fault in the respective one of the plurality of phase current sensors.

13. The control system of claim 9, further comprising the instruction set being executable to compare the extrapolated current for the respective one of the plurality of phase current sensors and a maximum value for the measured current for the respective one of the plurality of phase current sensors in combination with a learned offset.

14. The control system of claim 13, wherein the instruction set is executable to detect the fault in the respective one of the plurality of phase current sensors when the extrapolated current for the respective one of the plurality of phase current sensors differs from the maximum value for the measured current for the respective one of the plurality of phase current sensors in combination with the learned offset by an amount that is greater than a second threshold.

15. A method for monitoring a control system for a multi-phase electric machine, comprising:
    monitoring, via a plurality of phase current sensors, the plurality of phase currents transferred from an inverter to the multi-phase electric machine;
    detecting that one of the plurality of phase currents is outside a linear measurement range of a respective one of the plurality of phase current sensors based upon the phase currents from others of the plurality of phase current sensors;
    determining an extrapolated current for the respective one of the plurality of phase current sensors;
    evaluating the respective one of the plurality of phase current sensors, including:
        determining a zero-sum-shift parameter based upon the extrapolated current for the respective one of the plurality of phase current sensors, and
        evaluating the respective one of the plurality of phase current sensors based upon the zero-sum-shift parameter and a respective one of the monitored phase currents; and
    detecting a fault in the respective one of the plurality of phase current sensors based thereon.

16. The method of claim 15, wherein determining the zero-sum-shift parameter based upon the extrapolated current for the respective one of the plurality of phase current sensors comprises determining a linear approximation of a signal output of the respective one of the plurality of phase current sensors in relation to the extrapolated current.

17. The method of claim 15, further comprising controlling operation of the electric machine in response to the fault in the respective one of the plurality of phase current sensors.

* * * * *